US011915646B2

United States Patent
Liu et al.

(10) Patent No.: US 11,915,646 B2
(45) Date of Patent: Feb. 27, 2024

(54) ORGANIC LIGHT-EMITTING DIODE PIXEL CIRCUIT AND DRIVING METHOD THEREFOR, AND DISPLAY PANEL AND DISPLAY APPARATUS

(71) Applicant: BOE Technology Group Co., Ltd., Beijing (CN)

(72) Inventors: Weixing Liu, Beijing (CN); Kai Guo, Beijing (CN); Tieshi Wang, Beijing (CN); Wei Qin, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/762,092

(22) PCT Filed: May 21, 2021

(86) PCT No.: PCT/CN2021/095295
§ 371 (c)(1),
(2) Date: Mar. 21, 2022

(87) PCT Pub. No.: WO2021/249164
PCT Pub. Date: Dec. 16, 2021

(65) Prior Publication Data
US 2022/0351681 A1    Nov. 3, 2022

(30) Foreign Application Priority Data
Jun. 10, 2020  (CN) .................. 202010526605.X

(51) Int. Cl.
*G09G 3/3233*  (2016.01)
*H01L 27/32*   (2006.01)
*H10K 59/131*  (2023.01)

(52) U.S. Cl.
CPC ......... *G09G 3/3233* (2013.01); *H10K 59/131* (2023.02); *G09G 2300/0426* (2013.01);
(Continued)

(58) Field of Classification Search
CPC ......... G09G 3/3233; G09G 2300/0426; G09G 2310/061; G09G 2320/0233;
(Continued)

(56) References Cited

U.S. PATENT DOCUMENTS

2007/0114522 A1* 5/2007 Kwok .................. H10K 59/176
                                                       257/40
2008/0088547 A1   4/2008 Chan et al.
(Continued)

FOREIGN PATENT DOCUMENTS

CN    203325414    * 4/2013 ........... G09G 3/3233
CN    103383834 A    11/2013
(Continued)

OTHER PUBLICATIONS

International Search Report for PCT/CN2021/095295 dated Aug. 2, 2021.
(Continued)

*Primary Examiner* — Kwang-Su Yang
(74) *Attorney, Agent, or Firm* — Ling Wu; Stephen Wang; Ling and Yang Intellectual Property

(57) ABSTRACT

A pixel circuit, including: an input sub-circuit, a driving control sub-circuit, a light emission control sub-circuit, a driving sub-circuit, a first light-emitting element and a second light-emitting element, wherein the driving control sub-circuit comprises a capacitor; the input sub-circuit is used for providing a signal of a data signal end to a first node; the driving control sub-circuit adjusts the voltages of the first node, a second node and a third node by means of controlling the voltages at two ends of the capacitor; the light emission control sub-circuit is used for providing a signal of a first power supply signal end to the second node under the signal control of a light emission control signal end; and the driving sub-circuit is used for connecting or
(Continued)

disconnecting the connection between the second node and the third node under the signal control of the first node.

18 Claims, 8 Drawing Sheets

(52) U.S. Cl.
CPC ............... *G09G 2300/0842* (2013.01); *G09G 2310/061* (2013.01); *G09G 2310/08* (2013.01); *G09G 2320/0233* (2013.01); *G09G 2320/0257* (2013.01); *G09G 2320/043* (2013.01); *G09G 2330/021* (2013.01)

(58) Field of Classification Search
CPC ..... G09G 2320/0257; G09G 2320/043; G09G 2330/021; H10K 59/131
See application file for complete search history.

(56) References Cited

U.S. PATENT DOCUMENTS

| | | | |
|---|---|---|---|
| 2015/0206476 A1 | 7/2015 | Qi et al. | |
| 2015/0269886 A1* | 9/2015 | Tan | H04N 25/77 345/82 |
| 2015/0287359 A1 | 10/2015 | Qing et al. | |
| 2016/0012783 A1 | 1/2016 | Kimura et al. | |
| 2016/0307501 A1 | 10/2016 | Han | |
| 2018/0315374 A1 | 11/2018 | Zhang et al. | |
| 2018/0374417 A1 | 12/2018 | Yang et al. | |
| 2019/0081122 A1* | 3/2019 | Kim | H10K 59/38 |
| 2019/0279565 A1 | 9/2019 | Yang et al. | |
| 2019/0340979 A1 | 11/2019 | Yang et al. | |

FOREIGN PATENT DOCUMENTS

| | | |
|---|---|---|
| CN | 103531150 A | 1/2014 |
| CN | 104575386 A | 4/2015 |
| CN | 106097964 A | 11/2016 |
| CN | 106297672 A | 1/2017 |
| CN | 106486063 A | 3/2017 |
| CN | 107068057 A | 8/2017 |
| CN | 111261109 A | 6/2020 |
| CN | 111564138 A | 8/2020 |

OTHER PUBLICATIONS

The First Office Action dated Jan. 14, 2021 for Chinese Patent Application No. 202010526605.X and English Translation.
The Second Office Action dated Jul. 27, 2021 for Chinese Patent Application No. 202010526605.X and English Translation.

* cited by examiner

| in a reset stage, inputting a first power supply signal to a first power supply signal terminal VDD, inputting a second power supply signal to a second power supply signal terminal VSS, inputting a first scanning signal to a first scanning signal terminal S1, inputting a second scanning signal to a second scanning signal terminal S2, inputting a light-emitting control signal to a light-emitting control signal terminal EM, inputting a data signal to a data signal terminal Data, writing, by a driving control sub-circuit, a voltage of the first power supply signal to a first end of a capacitor C1 and a voltage of the second power supply signal to a second end of the capacitor C2, and writing a voltage of the data signal to a first node by an input sub-circuit | ～S10 |

↓

| in a compensation stage, controlling, by the driving control sub-circuit, a voltage at the first end of the capacitor C1 to be constant and a voltage at the second end of the capacitor C1 to be a voltage difference between the voltage of the data signal and a threshold voltage of a driving transistor | ～S20 |

↓

| in a light-emitting stage, by making the first power supply signal at a first level and the second power supply signal at a second level in a first light-emitting stage, writing the voltage at the second end of the capacitor C1 to a second node, and controlling the first light-emitting element to emit light and the second light-emitting element not to emit light; and by making the first power supply signal at the second level and the second power supply signal at the first level in a second light-emitting stage, writing the voltage at the second end of the capacitor C1 to a third node, and controlling the second light-emitting element to emit light and the first light-emitting element not to emit light | ～S30 |

FIG. 8

ORGANIC LIGHT-EMITTING DIODE PIXEL CIRCUIT AND DRIVING METHOD THEREFOR, AND DISPLAY PANEL AND DISPLAY APPARATUS

The present application claims the priority to Chinese Patent Application No. 202010526605.X, filed to the CNIPA on Jun. 10, 2020 and entitled "Pixel Circuit and Driving Method Therefor, and Display Panel and Display Apparatus", the content of which should be construed as being incorporated into the present application by reference.

TECHNICAL FIELD

Embodiments of the present disclosure relate to, but are not limited to, the field of display technology, and in particular to a pixel circuit, a driving method therefor, a display panel and a display apparatus.

BACKGROUND

An Organic Light-Emitting Diode (OLED) display panel utilizes OLEDs to emit light with different brightness, so that pixels corresponding to the OLEDs are displayed with corresponding brightness. Compared with a traditional thin film transistor liquid crystal display panel, the OLED display panel has a higher response speed, a higher contrast ratio and a wider viewing angle, and is an important development direction for display panels.

However, the phenomena such as brightness attenuation and afterimage will easily occur to OLED devices after light-emitting for long time, thus affecting the service life of display panels.

SUMMARY

The following is a summary for subject matter described in detail herein. The summary is not intended to limit the scope of protection of the claims.

In a first aspect, an embodiment of the present disclosure provides a pixel circuit, including: an input sub-circuit, a driving control sub-circuit, a light-emitting control sub-circuit, a driving sub-circuit, a first light-emitting element and a second light-emitting element; wherein the driving control sub-circuit includes a capacitor; the input sub-circuit is connected with a data signal terminal, a first scanning signal terminal and a first node respectively, and configured to provide a signal of the data signal terminal to the first node under the control of a signal of the first scanning signal terminal; the driving control sub-circuit is connected with the first scanning signal terminal, a second scanning signal terminal, a second power supply signal terminal, the first node, a second node and a third node respectively, and configured to adjust voltages of the first node, the second node and the third node by controlling voltages at two ends of the capacitor under the control of the signal of the first scanning signal terminal and a signal of the second scanning signal terminal; the light-emitting control sub-circuit is connected with a first power supply signal terminal, a light-emitting control signal terminal and the second node respectively, and configured to provide a signal of the first power supply signal terminal to the second node under the control of a signal of the light-emitting control signal terminal; the driving sub-circuit is connected with the first node, the second node and the third node respectively, and configured to connect the second node with the third node or disconnect the second node from the third node, drive the first light-emitting element to emit light in a first light-emitting time period and not emit light in a second light-emitting time period, and drive the second light-emitting element to emit light in the second light-emitting time period and not emit light in the first light-emitting time period, under the control of a signal of the first node; the first light-emitting element is connected with the third node and the second power supply signal terminal respectively; and the second light-emitting element is connected with the third node and the second power supply signal terminal respectively.

In a second aspect, an embodiment of the present disclosure provides a driving method for a pixel circuit, including: in a reset stage, inputting a first power supply signal to a first power supply signal terminal, inputting a second power supply signal to a second power supply input terminal, inputting a first scanning signal to a first scanning signal terminal, inputting a second scanning signal to a second scanning signal terminal, inputting a light-emitting control signal to a light-emitting control signal terminal, inputting a data signal to a data signal terminal, writing, by a driving control sub-circuit, a voltage of the first power supply signal to a first end of a capacitor and a voltage of the second power supply signal to a second end of the capacitor, and writing, by an input sub-circuit, a voltage of the data signal to a first node; in a compensation stage, controlling, by the driving control sub-circuit, a voltage at the first end of the capacitor to be constant and a voltage at the second end of the capacitor to be a voltage difference between the voltage of the data signal and a threshold voltage of a driving transistor; and in a light-emitting stage, by making the first power supply signal at a first level and the second power supply signal at a second level in a first light-emitting stage, writing the voltage at the second end of the capacitor to a second node of a driving sub-circuit, and controlling the first light-emitting element to emit light and the second light-emitting element not to emit light; and by making the first power supply signal at the second level and the second power supply signal at the first level in a second light-emitting stage, writing the voltage at the second end of the capacitor to a third node of the driving sub-circuit, and controlling the second light-emitting element to emit light and the first light-emitting element not to emit light.

In a third aspect, an embodiment of the present disclosure provides a display panel, including: a plurality of sub-pixels arranged in an array, each sub-pixel including a pixel circuit, wherein at least one pixel circuit adopts the pixel circuit described above.

In a fourth aspect, an embodiment of the present disclosure provides a display apparatus, including the display panel described above.

Other aspects will become apparent upon reading and understanding accompanying drawings and the detailed description.

BRIEF DESCRIPTION OF DRAWINGS

Accompanying drawings are used for providing an understanding of technical solutions of the present disclosure and form a part of the specification, are used for explaining the technical solutions of the present disclosure together with embodiments of the present disclosure, and do not constitute a limitation on the technical solutions of the present disclosure.

FIG. 6-1 is a working state diagram of a pixel circuit in a first light-emitting stage according to an embodiment of the present disclosure;

FIG. 6-2 is an equivalent circuit diagram of a pixel circuit in a first light-emitting stage according to an embodiment of the present disclosure;

FIG. 7-1 is a working state diagram of a pixel circuit in a second light-emitting stage according to an embodiment of the present disclosure;

FIG. 7-2 is an equivalent circuit diagram of a pixel circuit in a second light-emitting stage according to an embodiment of the present disclosure;

FIG. 8 is a flowchart of a driving method for a pixel circuit according to an embodiment of the present disclosure;

DETAILED DESCRIPTION

Figure 1:
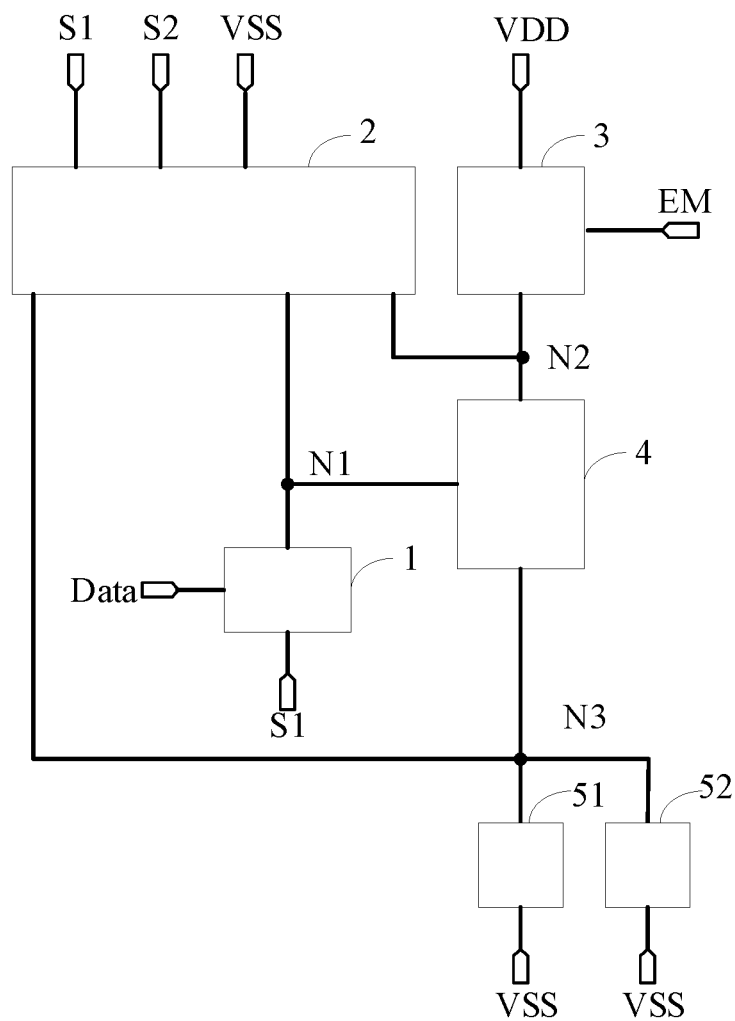
FIG. 1 is a schematic diagram of a structure of a pixel circuit according to an embodiment of the present disclosure.

In the accompanying drawings, a size of each constituent element, a thickness of a layer, or a region may be exaggerated sometimes for clarity. Therefore, one mode of the present disclosure is not necessarily limited to the size, and a shape and size of each component in the accompanying drawings do not reflect true scale. In addition, the accompanying drawings schematically show ideal examples, and one mode of the present disclosure is not limited to a shape, a numerical value, or the like shown in the accompanying drawings.

Ordinal numerals such as "first", "second", and "third" in the specification are set to avoid confusion of constituent elements, but are not intended to limit in terms of quantity.

In the specification, for convenience, words and sentences indicating orientations or positional relationships, such as "center", "upper", "lower", "front", "back", "vertical", "horizontal", "top", "bottom", "inside" and "outside", are used for describing positional relationships of constituent elements with reference to the accompanying drawings, and are merely for facilitating describing the specification and simplifying the description, rather than indicating or implying that referred apparatuses or elements must have particular orientations, and be constructed and operated in particular orientations. Thus, they cannot be construed as a limitation to the present disclosure. The positional relationships of the constituent elements appropriately change according to directions of describing the constituent elements. Therefore, the words and sentences are not limited to those described in the specification, but may be replaced appropriately according to a situation.

In the specification, unless otherwise specified and defined explicitly, the terms "install", "connect" and "link" should be broadly understood. For example, it may be a fixed connection, a detachable connection, or an integral connection; may be a mechanical connection or an electrical connection; and may be a direct connection, or an indirect connection through an intermediary, or an internal connection between two elements. Those of ordinary skill in the art may understand the meanings of the above terms in the present disclosure according to specific situations.

In the specification, a transistor refers to an element that at least includes three terminals, that is, a gate electrode, a drain electrode and a source electrode. The transistor has a channel region between the drain electrode (drain electrode terminal, drain region, or drain electrode) and the source electrode (source electrode terminal, source region, or source electrode), and a current may flow through the drain electrode, the channel region, and the source region. It is to be noted that in the specification, the channel region refers to a region that a current mainly flows through.

In the specification, a first electrode may be a drain electrode and a second electrode may be a source electrode; or, a first electrode may be a source electrode and a second electrode may be a drain electrode. In cases that transistors with opposite polarities are used, or a direction of a current changes during work of a circuit, or the like, functions of the "source electrode" and the "drain electrode" may sometimes be exchanged. Therefore, the "source electrode" and the "drain electrode" may be exchanged in the specification.

In the specification, an "electric connection" includes a case where constituent elements are connected together through an element having some electric function. There is no specific restriction on the "element having some electrical function" as long as it may transmit and receive electrical signals between connected constituent elements. An example of the "element having some electric function" includes not only an electrode and a wiring, but also a switching element such as a transistor, a resistor, an inductor, a capacitor, and other elements having various functions, etc.

In the specification, "film" and "layer" may be exchanged. For example, a "conductive layer" may be replaced with a "conductive film" sometimes. Similarly, an "insulating film" may be replaced with an "insulating layer" sometimes.

In the present disclosure, "about" refers to that a boundary is defined not so strictly and numerical values within process and measurement error ranges are allowed.

Transistors used in all embodiments of the present disclosure may be thin film transistors or field effect tubes or other devices with same characteristics. According to the function in the circuit, the transistors used in the embodiments of the present disclosure are mainly switching transistors. A source and a drain of a thin film transistor used here are symmetric, so the drain and the source thereof may be interchanged. In the embodiments of the present disclosure, one of the source and the drain is called a first electrode, and the other of the source and the drain is called a second electrode.

Furthermore, in the description of the embodiments of the present disclosure, the terms "first level" and "second level" are only used to distinguish the amplitudes of two levels. When the transistor is exemplified as a P-type thin film transistor, a signal level that triggers the transistor to be turned on is a low level, and when the transistor is exemplified as an N-type thin film transistor, a signal level that triggers the transistor to be turned on is a high level.

In the following examples, description is made with the driving transistor being a P-type thin film transistor, and other transistors are of a type that is same as or different from the driving transistor depending on the circuit design. Similarly, in other embodiments, the driving transistor may be shown as an N-type thin film transistor. Those of skill in the art may understand that the technical solution of the present disclosure may also be implemented by correspondingly changing the types of other transistors and inverting a plurality of driving signals and level signals (and/or making other additional adaptive modifications thereto).

FIG. 1 is a circuit diagram of a structure of a pixel circuit according to an embodiment of the present disclosure. The pixel circuit of this embodiment is configured to drive a first light-emitting element and a second light-emitting element to emit light at different time.

As shown in FIG. 1, the pixel circuit of this embodiment includes: an input sub-circuit 1, a driving control sub-circuit 2, a light-emitting control sub-circuit 3, a driving sub-circuit 4, a first light-emitting element 51 and a second light-emitting element 52; the driving control sub-circuit 2 includes a capacitor C1.

The input sub-circuit 1 is connected with a data signal terminal Data, a first scanning signal terminal S1 and a first node N1 respectively, and configured to provide a signal of the data signal terminal Data to the first node N1 under the control of a signal of the first scanning signal terminal S1.

The driving control sub-circuit 2 is connected with the first scanning signal terminal S1, a second scanning signal terminal S2, a second power supply signal terminal VSS, the first node N1, a second node N2 and a third node N3 respectively, and is configured to adjust voltages of the first node N1, the second node N2 and the third node N3 by controlling voltages at two ends of the capacitor C1 under the control of the signal of the first scanning signal terminal S1 and the signal of the second scanning signal terminal S2.

The light-emitting control sub-circuit 3 is connected with a first power supply signal terminal VDD, a light-emitting control signal terminal EM and the second node N2 respectively, and is configured to provide a signal of the first power supply signal terminal VDD to the second node N2 under the control of a signal of the light-emitting control signal terminal EM.

The driving sub-circuit 4 is connected with the first node N1, the second node N2 and the third node N3 respectively, and configured to connect the second node with the third node or disconnect the second node N2 from the third node N3, drive the first light-emitting element to emit light in a first light-emitting time period and not emit light in a second light-emitting time period, and drive the second light-emitting element to emit light in the second light-emitting time period and not emit light in the first light-emitting time period, under the control of a signal of the first node N1.

The first light-emitting element 51 is connected with the third node N3 and the second power supply signal terminal VSS respectively.

The second light-emitting element 52 is connected with the third node N3 and the second power supply signal terminal VSS respectively.

In an exemplary embodiment, the first light-emitting element includes a first Organic Light-Emitting Diode (OLED); the second light-emitting element includes a second organic light-emitting diode; an anode of the first organic light-emitting diode is connected with the third node N3, and a cathode of the first organic light-emitting diode is connected with the second power supply signal terminal VSS; and a cathode of the second organic light-emitting diode is connected with the third node N3, and an anode of the second organic light-emitting diode is connected with the second power supply signal terminal VSS.

In an exemplary embodiment, the first power supply signal terminal VDD provides a signal of a first level in the first light-emitting time period and a signal of a second level in the second light-emitting time period; and the second power supply signal terminal VSS provides a signal of the second level in the first light-emitting time period and a signal of the first level in the second light-emitting time period. That is, the first power supply signal terminal VDD provides an AC signal, and the second power supply signal terminal VSS provides an AC signal.

In an exemplary embodiment, a signal level of the first power supply signal terminal VDD in the first light-emitting time period is higher than a signal level of the second power supply signal terminal VSS, and the signal level of the first power supply signal terminal VDD in the second light-emitting time period is lower than the signal level of the second power supply signal terminal VSS.

The data signal terminal Data may be connected with a data line, the first scanning signal terminal S1 may be connected with a first-row scanning line, the second scanning signal terminal S2 may be connected with a second-row scanning line, and the first-row scanning line and the second-row scanning line are used for controlling on/off of the switches of pixels in one row. The signal of the first scanning signal terminal S1, the signal of the second scanning signal terminal S2, the signal of the first power supply signal terminal VDD and the signal of the second power supply signal terminal VSS are periodically varying pulse signals.

In an exemplary embodiment, the first light-emitting time period and the second light-emitting time period are each a half of a light-emitting time period of a one-frame image.

In the pixel circuit described above, two Organic Light-Emitting diodes (OLEDs) may be integrated in one pixel, and when one OLED emits light, the voltages at the two ends of the other OLED are reversely biased, thus prolonging the service life of the OLEDs and reducing the afterimage.

Figure 2:
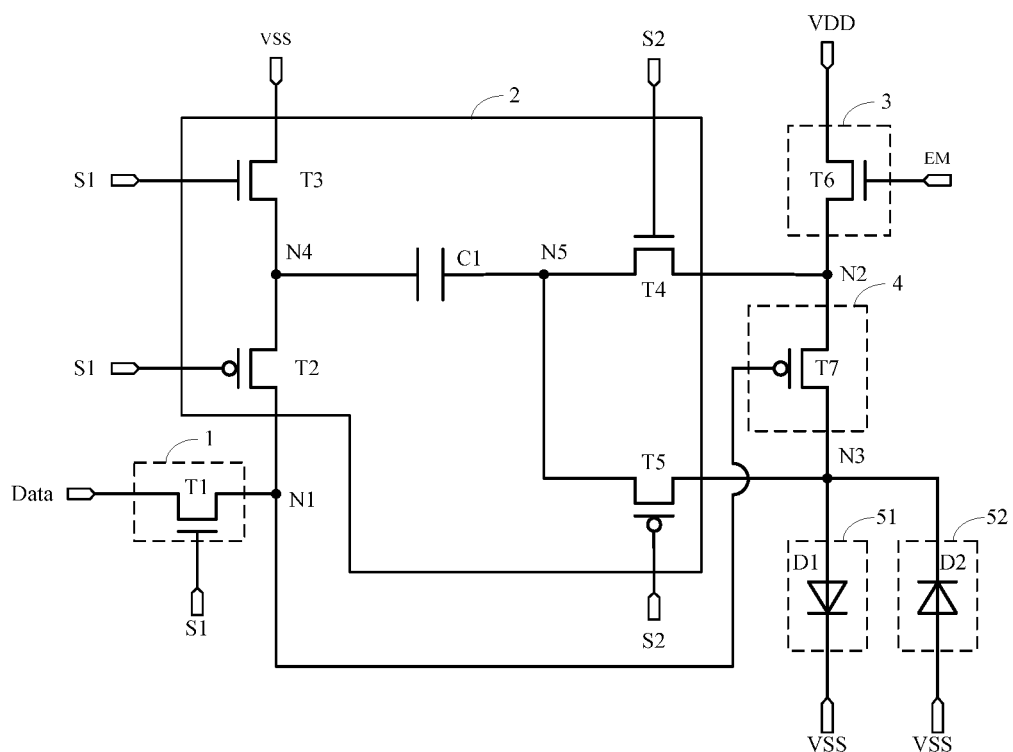
FIG. 2 is an equivalent circuit diagram of a pixel circuit according to an embodiment of the present disclosure.

FIG. 2 is an equivalent circuit diagram of a pixel circuit including seven transistors (T1-T7), one capacitor (C1) and two OLEDs (D1 and D2).

In an exemplary embodiment, as shown in FIG. 2, the input sub-circuit may include: a first transistor T1; a first electrode of the first transistor T1 is connected with the data signal terminal Data, a control electrode of the first transistor T1 is connected with the first scanning signal terminal S1, and a second electrode of the first transistor T1 is connected with the first node N1.

When the signal level of the first scanning signal terminal S1 is the first level, the first transistor T1 is in a turned-on state under the control of a signal of the first scanning signal terminal S1, and a signal of the data signal terminal Data may be provided to the first node N1.

The first transistor T1 is an N-type transistor.

FIG. 2 shows an exemplary structure of the input sub-circuit. It is readily understood by those of skill in the art that the implementation of the input sub-circuit is not limited to this as long as its function can be achieved.

In an exemplary embodiment, as shown in FIG. 2, the driving control sub-circuit may include: a second transistor T2, a third transistor T3, a fourth transistor T4, a fifth transistor T5 and the capacitor C1.

A first electrode of the second transistor T2 is connected with a fourth node N4, a control electrode of the second transistor T2 is connected with the first scanning signal terminal S1, and a second electrode of the second transistor T2 is connected with the first node N1.

A first electrode of the third transistor T3 is connected with the second power supply signal terminal VSS, a control electrode of the third transistor T3 is connected with the first scanning signal terminal S1, and a second electrode of the third transistor T3 is connected with the fourth node N4.

A first electrode of the fourth transistor T4 is connected with a fifth node N5, a control electrode of the fourth transistor T4 is connected with the second scanning signal terminal S2, and a second electrode of the fourth transistor T4 is connected with the second node N2.

A first electrode of the fifth transistor T5 is connected with the fifth node N5, a control electrode of the fifth transistor T5 is connected with the second scanning signal terminal S2, and a second electrode of the fifth transistor T5 is connected with the third node N3.

A first end of the capacitor C1 is connected with the fourth node N4, and a second end of the capacitor C1 is connected with the fifth node N5.

The third transistor T3 and the fourth transistor T4 are N-type transistors, and the second transistor T2 and the fifth transistor T5 are P-type transistors.

When the signal level of the first scanning signal terminal S1 is the first level, the third transistor T3 is in the turned-on state under the control of the signal of the first scanning signal terminal S1, and the signal of the second power supply terminal VSS may be provided to the fourth node N4; and when the signal level of the first scanning signal terminal S1 is the second level, the second transistor T2 is in the turned-on state under the control of the signal of the first scanning signal terminal S1, and the signal of the fourth node N4 may be provided to the first node N1.

When the signal level of the second scanning signal terminal S2 is the first level, the fourth transistor T4 is in the turned-on state under the control of the signal of the second scanning signal terminal S2, and the signal of the fifth node N5 may be provided to the second node N2; and when the signal level of the second scanning signal terminal S2 is the second level, the fifth transistor T5 is in the turned-on state under the control of the signal of the second scanning signal terminal S2, and the signal of the fifth node N5 may be provided to the third node N3.

FIG. 2 shows an exemplary structure of the driving control sub-circuit. It is readily understood by those of skill in the art that the implementation of the driving control sub-circuit is not limited to this as long as its function can be achieved.

In an exemplary embodiment, as shown in FIG. 2, the light-emitting control sub-circuit may include: a sixth transistor T6; a first electrode of the sixth transistor T6 is connected with the first power supply signal terminal VDD, a control electrode of the sixth transistor T6 is connected with the light-emitting control signal terminal EM, and a second electrode of the sixth transistor T6 is connected with the second node N2.

When the signal level of the light-emitting control signal terminal EM is the first level, the sixth transistor T6 is in the turned-on state under the control of the signal of the light-emitting control signal terminal EM, and the signal of the first power supply signal terminal VDD may be provided to the second node N2.

The sixth transistor T6 is an N-type transistor.

FIG. 2 shows an exemplary structure of the light-emitting control sub-circuit. It is readily understood by those of skill in the art that the implementation of the light-emitting control sub-circuit is not limited to this as long as its function can be achieved.

In an exemplary embodiment, as shown in FIG. 2, the driving sub-circuit 4 may include: a seventh transistor T7; a first electrode of the seventh transistor T7 is connected with the second node N2, a control electrode of the seventh transistor T7 is connected with the first node N1, and a second electrode of the seventh transistor T7 is connected with the third node N3.

The seventh transistor T7 is configured to connect the second node with the third node or disconnect the second node N2 from the third node N3 under the control of the signal of the first node N1.

The seventh transistor T7 is a P-type transistor.

FIG. 2 shows an exemplary structure of the driving sub-circuit. It is readily understood by those of skill in the art that the implementation of the driving sub-circuit is not limited to this as long as its function can be achieved.

In an exemplary embodiment, as shown in FIG. 2, the first light-emitting element 51 is a first organic light-emitting diode D1, the second light-emitting element 52 is a second organic light-emitting diode D2; an anode of the first organic light-emitting diode D1 is connected with the third node N3, and a cathode of the first organic light-emitting diode D1 is connected with the second power supply signal terminal VSS; and a cathode of the second organic light-emitting diode D2 is connected with the third node N3, and an anode of the second organic light-emitting diode D2 is connected with the second power supply signal terminal VSS.

In this embodiment, the transistors T1, T3, T4 and T6 may be N-type thin film transistors, and the transistors T2, T5 and T7 may be P-type thin film transistors. In addition, considering that a leakage current of a low-temperature polycrystalline silicon thin film transistor is relatively small, all the transistors in this embodiment may be low-temperature polycrystalline silicon thin film transistors, and a thin film transistor with a bottom gate structure or a thin film transistor with a top gate structure may be selected for the thin film transistor.

In an exemplary embodiment, as shown in FIG. 2, the pixel circuit includes: an input sub-circuit 1, a driving control sub-circuit 2, a light-emitting control sub-circuit 3, a driving sub-circuit 4, a first light-emitting element 51 and a second light-emitting element 52; the driving control sub-circuit 2 includes a capacitor C1; the first light-emitting element 51 is a first organic light-emitting diode D1, and the second light-emitting element 52 is a second organic light-emitting diode D2.

The input sub-circuit includes: a first transistor; a first electrode of the first transistor is connected with a data signal terminal, a control electrode of the first transistor is connected with a first scanning signal terminal, and a second electrode of the first transistor is connected with a first node.

The driving control sub-circuit includes: a second transistor, a third transistor, a fourth transistor, a fifth transistor and a capacitor; a first electrode of the second transistor is connected with a fourth node, a control electrode of the second transistor is connected with the first scanning signal terminal, and a second electrode of the second transistor is connected with the first node; a first electrode of the third transistor is connected with a second power supply signal terminal, a control electrode of the third transistor is connected with the first scanning signal terminal, and a second electrode of the third transistor is connected with the fourth node; a first electrode of the fourth transistor is connected with a fifth node, a control electrode of the fourth transistor is connected with the second scanning signal terminal, and a second electrode of the fourth transistor is connected with the second node; a first electrode of the fifth transistor is connected with the fifth node, a control electrode of the fifth transistor is connected with the second scanning signal terminal, and a second electrode of the fifth transistor is connected with a third node; and a first end of the capacitor is connected with the fourth node, and a second end of the capacitor is connected with the fifth node.

The light-emitting control sub-circuit includes: a sixth transistor; a first electrode of the sixth transistor is connected with the first power supply signal terminal, a control electrode of the sixth transistor is connected with a light-emitting control signal terminal, and a second electrode of the sixth transistor is connected with the second node.

The driving sub-circuit includes: a seventh transistor; a first electrode of the seventh transistor is connected with the second node, a control electrode of the seventh transistor is connected with the first node, and a second electrode of the seventh transistor is connected with the third node.

The first transistor, the third transistor, the fourth transistor and the sixth transistor are N-type transistors, and the second transistor, the fifth transistor and the seventh transistor are P-type transistors.

The pixel circuit shown in FIG. 2 may compensate the threshold voltage of the driving transistor (T7) by using the capacitor C1, which can avoid non-uniformity of brightness caused by non-uniformity of the threshold voltage of the driving transistor, and improve brightness uniformity.

Figure 5:
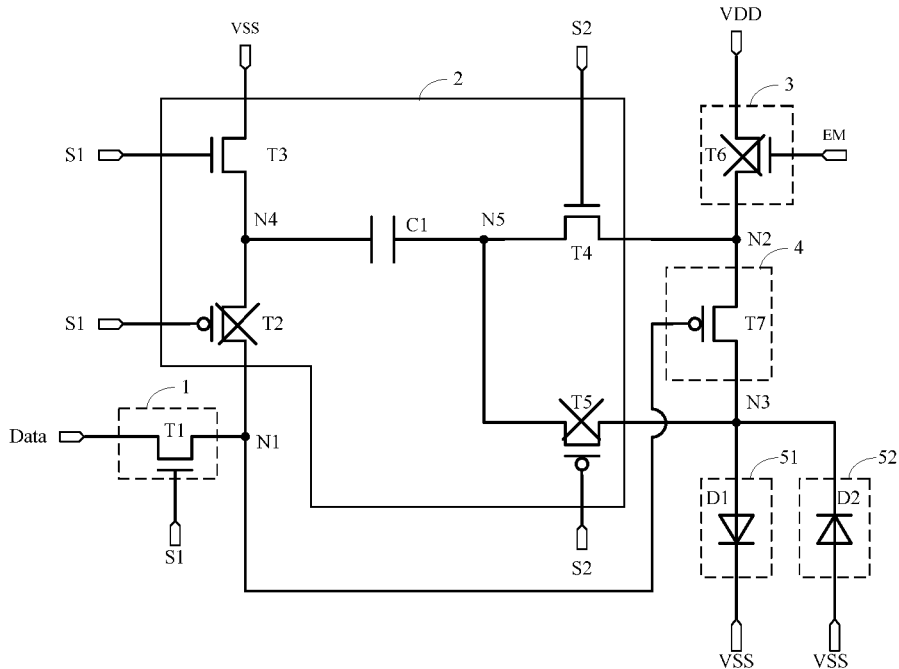
FIG. 5 is a working state diagram of a pixel circuit in a compensation stage according to an embodiment of the present disclosure.
Figures 1, 6:
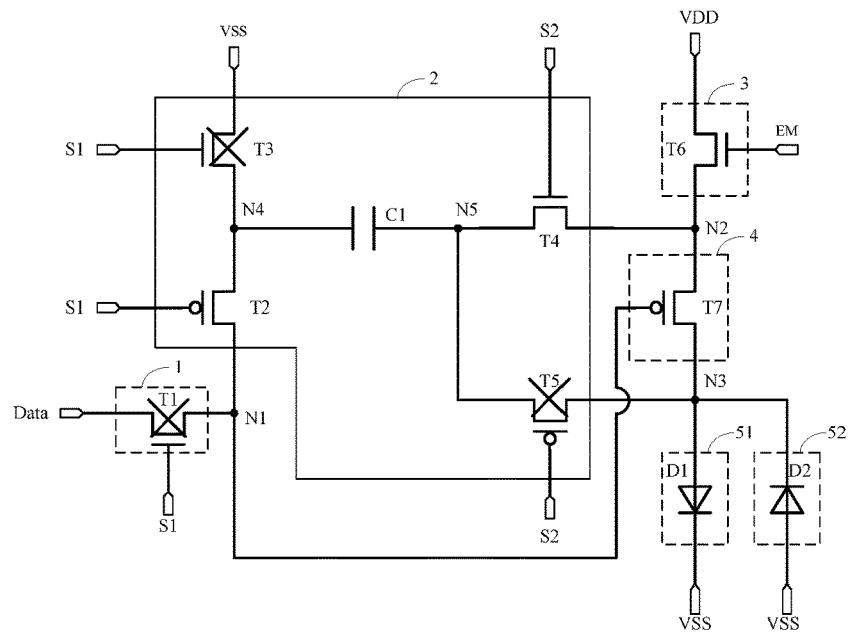
Figures 2, 6:
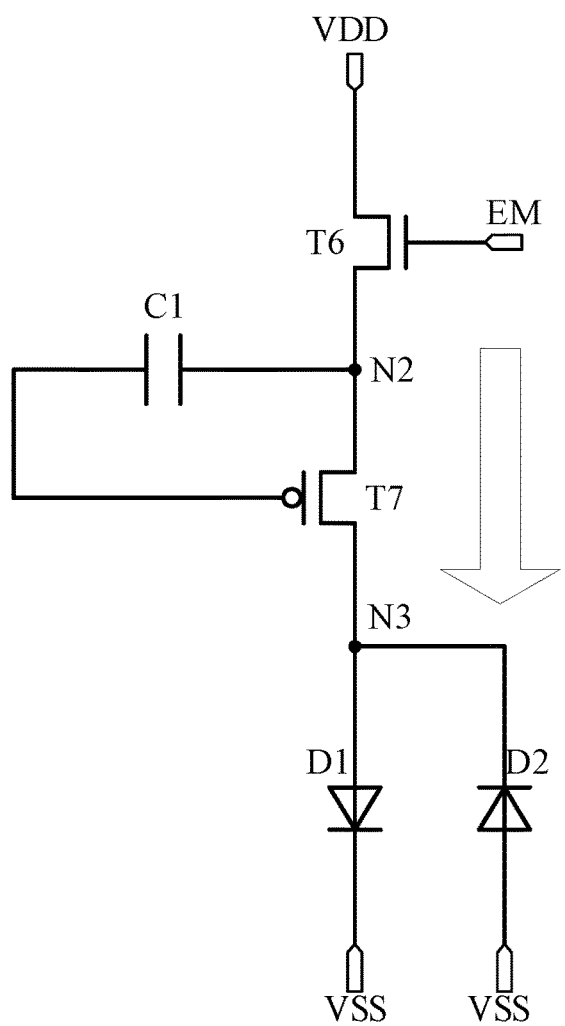
Figures 1, 7:
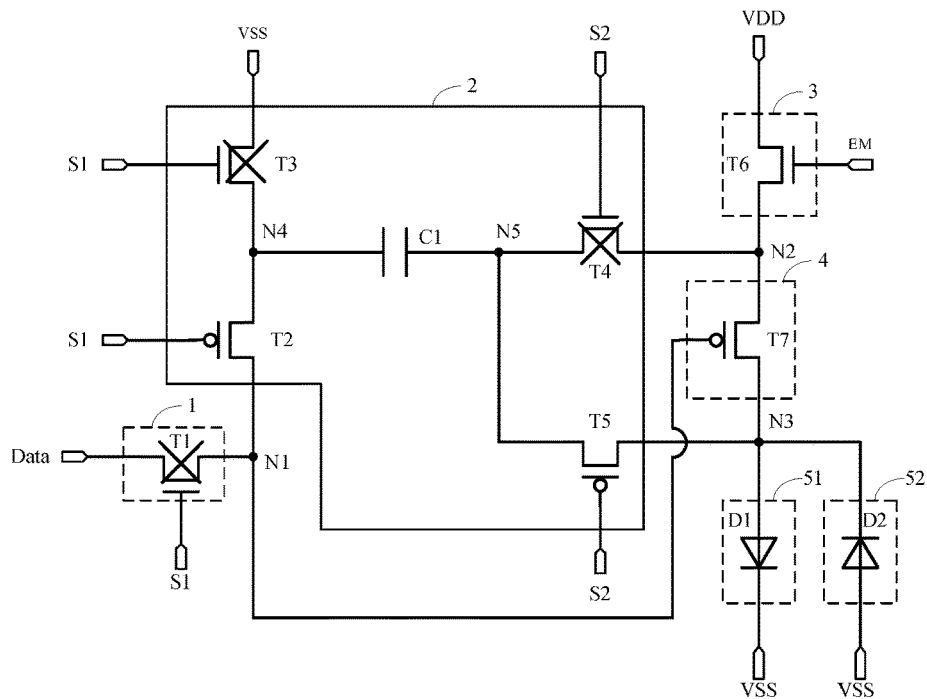
Figures 2, 7:
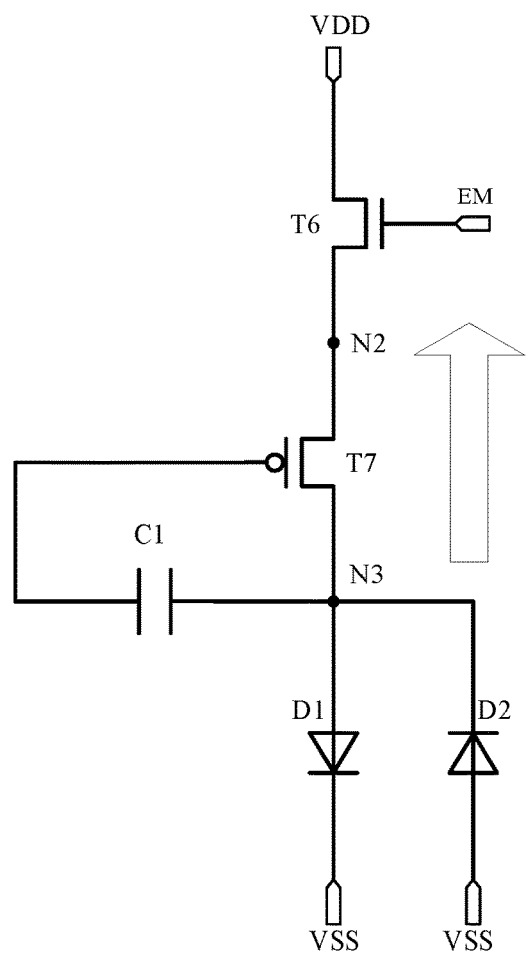

The technical solution of this embodiment is described below through a working process of the pixel circuit. Taking the transistors T1, T3, T4 and T6 of the pixel circuit in this embodiment being N-type thin film transistors and the transistors T2, T5 and T7 being P-type thin film transistors as an example, FIG. 3 is a working timing diagram of a pixel circuit according to an embodiment of the present disclosure, FIG. 4 is a working state diagram of a pixel circuit in a reset stage, FIG. 5 is a working state diagram of a pixel circuit in a compensation stage, FIG. 6-1 is a working state diagram of a pixel circuit in a light-emitting stage (a first light-emitting stage), FIG. 6-2 is an equivalent circuit diagram of a pixel circuit in a first light-emitting stage, FIG. 7-1 is a working state diagram of a pixel circuit in a light-emitting stage (a second light-emitting stage), and FIG. 7-2 is an equivalent circuit diagram of a pixel circuit in a second light-emitting stage.

Figure 3:
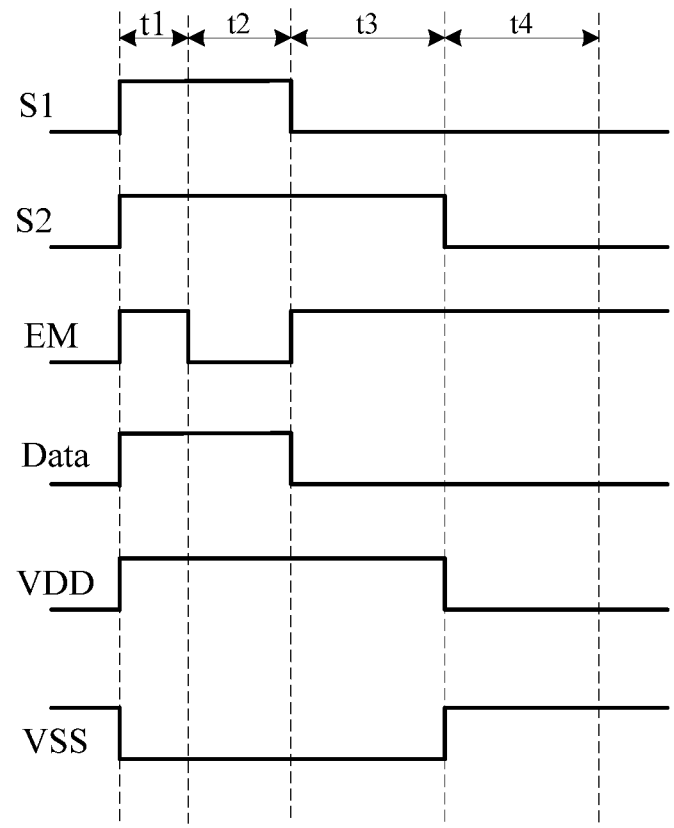
FIG. 3 is a working timing diagram of a pixel circuit according to an embodiment of the present disclosure.

As shown in FIG. 3, the working period of the pixel circuit may be the display time of a one-frame image, but is not limited to this. The working period of the pixel circuit may include a reset stage, a compensation stage, a first light-emitting stage and a second light-emitting stage which are sequentially set.

Figure 4:
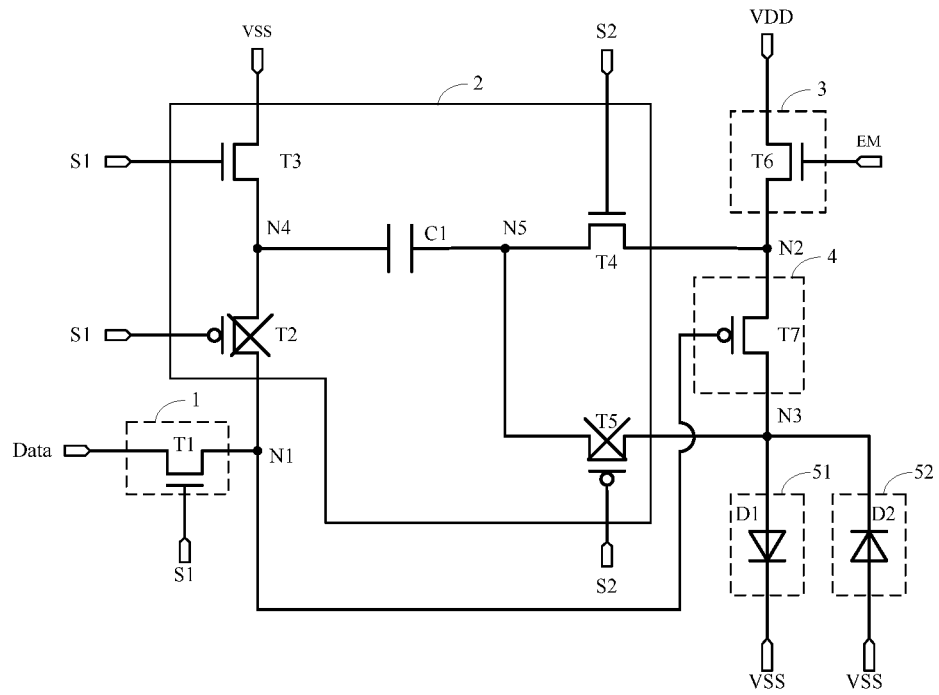
FIG. 4 is a working state diagram of a pixel circuit in a reset stage according to an embodiment of the present disclosure.

As shown in FIG. 4, in the reset stage t1, S1, S2, VDD and EM provide high-level signals, and VSS provides a low-level signal. T1, T3, T4 and T6 are in the turned-on state, T2 and T5 are in the turned-off state, and T7 is not completely turned off. T3 is turned on, and the signal of the second power supply signal terminal VSS is provided to the fourth node N4. T4 and T6 are in the turned-on state, and the signal of the first power supply signal terminal VDD is provided to the fifth node N5. T1 is turned on, and the signal of the data signal terminal Data is provided to the first node N1. The voltage at the first end of the capacitor C1 is equal to the voltage at the fourth node N4, and the voltage at the second end of the capacitor C1 is equal to the voltage at the fifth node N5.

In the reset stage, the voltages of the first node N1, the fourth node N4 and the fifth node N5 are shown in Table 1 below.

TABLE 1

| Node | First node N1 | Fourth node N4 | Fifth node N5 |
| --- | --- | --- | --- |
| Voltage | $U_{Data}$ | $U_{VSS}$ | $U_{VDD}$ |

Therefore, the voltage difference $U_{C1}$ between the two ends of the capacitor C1 is equal to $U_{VDD}$-$U_{VSS}$, which is equivalent to resetting the capacitor C1.

As shown in FIG. 5, in the compensation stage t2, S1, S2 and VDD provide high-level signals, and EM and VSS provide low-level signals. T1, T3 and T4 are in the turned-on state, T2, T5 and T6 are in the turned-off state, T7 is not completely turned off, there is a leakage current, and T7 has a current direction from the second node N2 to the third node N3. T3 is turned on, and the signal of the second power supply signal terminal VSS is provided to the fourth node N4. T4 is in the turned-on state, and the potential of the fifth node N5 drops to $U_{Data}$-$V_{th}$ due to the leakage current in T7. When the potential of the fifth node N5 drops to $U_{Data}$-$V_{th}$, T7 is completely turned off (after that, there is no leakage current at the source and drain terminals of T7). $V_{th}$ is the threshold voltage of the driving transistor (T7).

In the compensation stage, the voltages of the first node N1, the fourth node N4 and the fifth node N5 are shown in Table 2 below.

TABLE 2

| Node | First node N1 | Fourth node N4 | Fifth node N5 |
| --- | --- | --- | --- |
| Voltage | $U_{Data}$ | $U_{VSS}$ | $U_{Data}$ - $V_{th}$ |

As shown in FIG. 6-1, in the first light-emitting stage t3, S2, EM and VDD provide high-level signals, and S1 and VSS provide low-level signals. T2, T4, T6 and T7 are in the turned-on state, and T1, T3 and T5 are in the turned-off state. As shown in FIG. 6-2, the driving transistor T7 is turned on, the current in T7 flows from the second node N2 to the third node N3, the source of the driving transistor T7 is connected with the second node N2, the first organic light-emitting diode D1 is turned on in a forward direction and emits light, and the second organic light-emitting diode D2 is turned off in a reverse direction and does not emit light.

The current $I_{OLED}$ driving OLED to emit light may be represented by the following formula (1):

$$I_{OLED} = \tfrac{1}{2}k(V_{gs}-V_{th})^2 \qquad (1)$$

wherein $V_{gs}$ is a voltage difference between the gate and the source of the driving transistor (T7), k is a parameter related to the process parameters and feature sizes of the driving transistor, and $V_{th}$ is the threshold voltage of the driving transistor (T7).

The voltage difference $V_{gs}$ between the gate and the source of the driving transistor (T7) is the voltage difference between the two ends of the capacitor C1, so $V_{gs}$ may be determined by the following formula (2):

$$V_{gs} = U_{VSS}-(U_{Data}-V_{th}) = U_{VSS}-U_{Data}+V_{th}; \qquad (2)$$

then the current $I_{OLED}$ driving OLED to emit light may be represented by the following formula (3):

$$I_{OLED} = \tfrac{1}{2}k(U_{VSS}-U_{Data}+V_{th}-V_{th})^2 = \tfrac{1}{2}k(U_{VSS}-U_{Data})^2. \qquad (3)$$

According to the above formula, after the capacitor C1 is used, the driving current driving the first organic light-emitting diode D1 to emit light is independent of the threshold voltage $V_{th}$ of the driving transistor.

In the related art, due to the process uniformity issue in the process and transistor characteristic drift caused by long-time operation of transistors, there is a difference in the threshold voltage $V_{th}$ of different driving transistors on the display panel, resulting in non-uniformity in the brightness of the display panel. In the above embodiments provided by the present disclosure, the threshold voltage $V_{th}$ of the driving transistor is compensated by introducing the capacitor C1, so that the driving current driving the light-emitting device OLED to emit light is independent of the threshold voltage $V_{th}$ of the driving transistor, which can avoid non-uniformity in brightness caused by non-uniformity in the threshold voltage of the driving transistors and improve brightness uniformity.

As shown in FIG. 7-1, in the second light-emitting stage t4, EM and VSS provide high-level signals, and S1, S2 and VDD provide low-level signals. T2, T5, T6 and T7 are in the turned-on state, and T1, T3 and T4 are in the turned-off state. As shown in FIG. 7-2, the driving transistor T7 is turned on, the current in T7 flows from the third node N3 to the second node N2, the source of the driving transistor T7 is connected with the third node N3, the second organic light-emitting diode D2 is turned on in the forward direction and emits light, and the first organic light-emitting diode D1 is turned off in the reverse direction, and does not emit light.

Similar to the first light-emitting stage, the voltage difference $V_{gs}$ between the gate and the source of the driving transistor (T7) is the voltage difference between the two ends of the capacitor C1, so $V_{gs}$ may be determined by the following formula (2):

$$V_{gs} = U_{VSS} - (U_{Data} - V_{th}) = U_{VSS} - U_{Data} + V_{th}; \quad (2)$$

then the current $I_{OLED}$ driving OLED to emit light may be represented by the following formula (3):

$$I_{OLED} = \tfrac{1}{2}k(U_{VSS} - U_{Data} + V_{th} - V_{th})^2 = \tfrac{1}{2}k(U_{VSS} - U_{Data})^2. \quad (3)$$

According to the above formula, after the capacitor C1 is used, the driving current driving the second organic light-emitting diode D2 to emit light is independent of the threshold voltage $V_{th}$ of the driving transistor.

In the above pixel circuit, two organic light-emitting diodes are gated at different time, and when one organic light-emitting diode emits light, the other organic light-emitting diode is reversely biased, thereby improving the afterimage and prolonging the service life of the OLED device.

FIG. 8 is a flowchart of a driving method for a pixel circuit according to an embodiment of the present disclosure. As shown in FIG. 8, the driving method for the pixel circuit according to this embodiment may include the following acts.

In act S10, in a reset stage, a first power supply signal is input to a first power supply signal terminal VDD, a second power supply signal is input to a second power supply input terminal VSS, a first scanning signal is input to a first scanning signal terminal S1, a second scanning signal is input to a second scanning signal terminal S2, a light-emitting control signal is input to a light-emitting control signal terminal EM, a data signal is input to a data signal terminal Data, a voltage of the first power supply signal is written to a first end of a capacitor C1 and a voltage of the second power supply signal is written to a second end of the capacitor C2 by a driving control sub-circuit, and a voltage of the data signal is written to a first node by an input sub-circuit;

In act S20, in a compensation stage, a voltage at the first end of the capacitor C1 is controlled to be constant and a voltage at the second end of the capacitor C1 is controlled to be a voltage difference between the voltage of the data signal and a threshold voltage of a driving transistor, by the driving control sub-circuit; and In act S30, in a light-emitting stage, by making the first power supply signal at a first level and the second power supply signal at a second level in a first light-emitting stage, the voltage at the second end of the capacitor C1 is written to a second node of a driving sub-circuit, and the first light-emitting element is controlled to emit light and the second light-emitting element is controlled not to emit light; and by making the first power supply signal at the second level and the second power supply signal at the first level in a second light-emitting stage, the voltage at the second end of the capacitor C1 is written to a third node of the driving sub-circuit, and the second light-emitting element is controlled to emit light and the first light-emitting element is controlled not to emit light.

In an exemplary embodiment, the first light-emitting time period and the second light-emitting time period are each a half of a light-emitting time period of a one-frame image.

Figure 9:
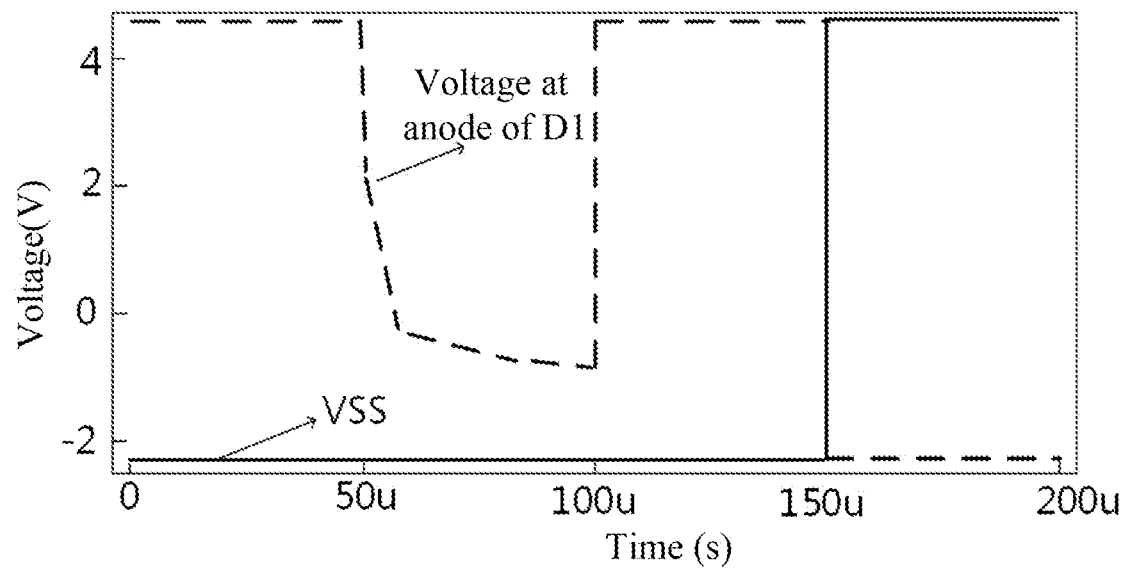
FIG. 9 is a voltage variation curve of an anode (a cathode of a second organic light-emitting diode D2) and a cathode (an anode of the second organic light-emitting diode D2) of a first organic light-emitting diode D1.

FIG. 9 is a voltage variation curve of an anode (a cathode of a second organic light-emitting diode D2) and a cathode (an anode of the second organic light-emitting diode D2) of a first organic light-emitting diode D1.

When the voltage Vdd of the first power supply signal is equal to 4.6V, the voltage Vss of the second power supply signal is equal to 2.3V and the voltage Vdata of the data signal is equal to 1V, it can be seen from FIG. 9 that D2 may be reversely biased when D1 emits light, and D1 may be reversely biased when D2 emits light.

Figure 10:
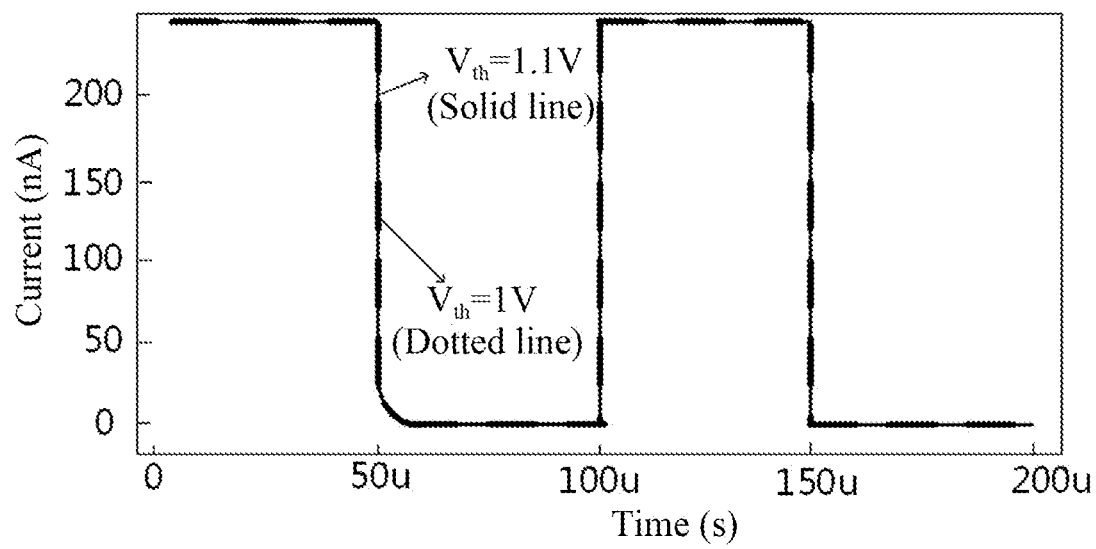
FIG. 10 is a variation curve of a driving current $I_{OLED}$ of a driving transistor when a threshold voltage of the driving transistor varies.

FIG. 10 is a variation curve of a driving current $I_{OLED}$ of a driving transistor when a threshold voltage of the driving transistor varies. The solid line represents a variation curve of the driving current $I_{OLED}$ when the threshold voltage $V_{th}$=1.1V, and the dotted line represents a variation curve of the driving current $I_{OLED}$ when the threshold voltage $V_{th}$=1V. As can be seen from FIG. 10, the driving current $I_{OLED}$ of the driving transistor is independent of the threshold voltage of the driving transistor. Therefore, the pixel circuit according to the embodiment of the present disclosure can compensate the threshold voltage of the driving transistor, thereby achieving the uniformity of the display brightness of the panel.

An embodiment of the present disclosure further provides a display panel, the display panel includes: a plurality of sub-pixels arranged in an array, each sub-pixel includes a pixel circuit, at least one pixel circuit adopts the pixel circuit provided by the above embodiment.

Figure 11:
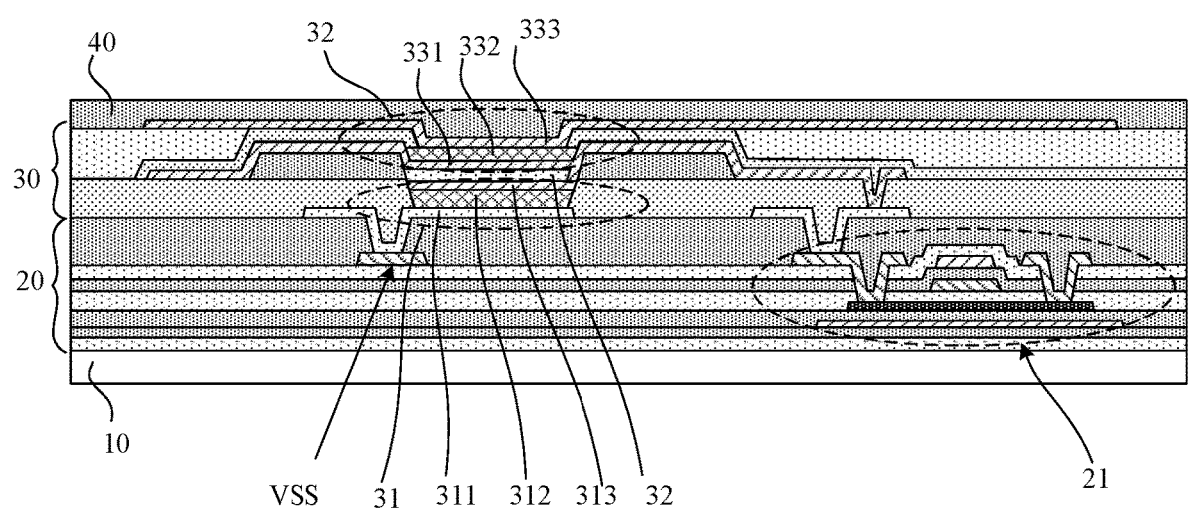
FIG. 11 is a schematic sectional view of sub-pixels of a display panel according to an embodiment of the present disclosure.

FIG. 11 is a schematic sectional view of sub-pixels of a display panel according to an embodiment of the present disclosure. As shown in FIG. 11, a sub-pixel may include: a substrate 10, a circuit structure layer 20 disposed on the substrate 10, a light-emitting structure layer 30 disposed on the circuit structure layer 20, and an encapsulation layer 34 disposed on the light-emitting structure layer 30. The circuit structure layer 20 includes a driving circuit in a pixel circuit, and a driving transistor is taken as an example in FIG. 11.

In an exemplary embodiment, the circuit structure layer 20 may include: a power supply line VSS and a driving transistor 21.

In an exemplary embodiment, the light-emitting structure layer 30 may include: a first light-emitting unit 31, an isolation layer 32 disposed on the first light-emitting unit 31, and a second light-emitting unit 33 disposed on the isolation layer 32.

In an exemplary embodiment, the first light-emitting unit 31 may include: a first electrode layer 311, a first light-emitting layer 312 disposed on the first electrode layer 311, and a second electrode layer 313 disposed on the first light-emitting layer 312. The second light-emitting unit 33 may include: a third electrode layer 331 disposed on the isolation layer 32, a second light-emitting layer 332 disposed on the third electrode layer 331, and a fourth electrode layer 333 disposed on the second light-emitting layer 332.

The first electrode layer 311 may include a first anode of the first light-emitting unit 31, and the first anode may be connected with the power supply line VSS in the circuit structure layer 20 through a via. The second electrode layer 313 may include a first cathode of the first light-emitting unit 31, and the first cathode may be connected with a first electrode of the driving transistor 21 in the circuit structure layer 20 through a via.

The third electrode layer 331 includes a second anode of the second light-emitting unit 33, and the second anode may be connected with the first electrode of the driving transistor 21 in the circuit structure layer 20 through a via. The fourth electrode layer 333 includes a second cathode of the second light-emitting unit 33, and the second cathode may be connected with the power supply line VSS in the circuit structure layer 20 through a lead structure in a peripheral region.

In the above structure, the first cathode of the first light-emitting unit 31 and the second anode of the second light-emitting unit 33 are both connected with the first electrode of the driving transistor 21, and the first anode of the first light-emitting unit 31 and the second cathode of the second light-emitting unit 33 are both connected with the power supply line VSS. If the AC signal output from the power supply line VSS is a high-level signal, the first light-emitting unit 31 emits light and the second light-emitting element 33 is turned off, and if the AC signal output from the power supply line VSS is a low-level signal, the first light-emitting unit 31 is turned off and the second light-emitting unit 33 emits light. For a P-type driving transistor, the current flows from the source to the drain of the P-type driving transistor. If the current flows from the first electrode to the second electrode of the P-type driving transistor, the first electrode is the source and the second electrode is the drain. If the current flows from the second electrode to the first electrode of the P-type driving transistor, the second electrode is the source and the first electrode is the drain. When the P-type driving transistor is connected with an external AC signal to be controlled, the first electrode (or the second electrode) may be regarded as the drain of the driving transistor in one time period and as the source of the driving transistor in another time period.

The first light-emitting unit 31 in FIG. 11 corresponds to the second organic light-emitting diode D2 in FIG. 2, FIG. 4, FIG. 5, FIG. 6-1, FIG. 6-2, FIG. 7-1 and FIG. 7-2. The second light-emitting unit 33 in FIG. 11 corresponds to the first organic light-emitting diode D1 in FIG. 2, FIG. 4, FIG. 5, FIG. 6-1, FIG. 6-2, FIG. 7-1 and FIG. 7-2.

In an exemplary embodiment, in addition to the driving transistor 21, the circuit structure layer 20 may also include other transistors; and the power supply line VSS and the source and drain metal layers of the driving transistor 21 are disposed on the same layer and formed by a single patterning process. The isolation layer may be composed of silicon oxide and silicon nitride, and plays the role of insulating and support.

An embodiment of the present disclosure further provides a display apparatus, including the display panel according to an embodiment of the present disclosure. For the description of the display apparatus, reference may be made to the contents of the previous embodiments, which will not be repeated here.

The display apparatus according to an embodiment of the present disclosure may be an organic light-emitting display apparatus. The display apparatus may be any product or component with a display function, such as a mobile phone, a tablet computer, a television, a display, a notebook computer, a digital photo frame, a navigator, etc. Other essential components of the display apparatus are those that those of ordinary skill in the art would understand the display apparatus to have, which will not be repeated here, and should not be taken as a limitation to the present disclosure.

Although the embodiments disclosed in the present disclosure are as above, the described contents are only embodiments adopted for convenience of understanding the present disclosure and are not intended to limit the present disclosure. Any skill in the art to which the present disclosure pertains can make any modifications and variations in implementation manners and details without departing from the spirit and scope of the present disclosure. However, the scope of patent protection of the present disclosure should be subject to the scope defined by the appended claims.

The invention claimed is:

1. A pixel circuit, comprising: an input sub-circuit; a driving control sub-circuit; a light-emitting control sub-circuit; a driving sub-circuit; a first light-emitting element; and a second light-emitting element, wherein:

the driving control sub-circuit comprises a capacitor;

the input sub-circuit is connected with a data signal terminal, a first scanning signal terminal and a first node respectively, and configured to provide a signal of the data signal terminal to the first node under control of a signal of the first scanning signal terminal;

the driving control sub-circuit is connected with the first scanning signal terminal, a second scanning signal terminal, a second power supply signal terminal, the first node, a second node and a third node respectively, and configured to adjust voltages of the first node, the second node and the third node by controlling voltages at two ends of the capacitor under control of the signal of the first scanning signal terminal and a signal of the second scanning signal terminal;

the light-emitting control sub-circuit is connected with a first power supply signal terminal, a light-emitting control signal terminal and the second node respectively, and configured to provide a signal of the first power supply signal terminal to the second node under control of a signal of the light-emitting control signal terminal;

the driving sub-circuit is connected with the first node, the second node and the third node respectively, and configured to, under control of a signal of the first node, connect the second node with the third node or disconnect the second node from the third node, drive the first light-emitting element to emit light in a first light-emitting time period and not emit light in a second light-emitting time period, and drive the second light-emitting element to emit light in the second light-emitting time period and not emit light in the first light-emitting time period;

the first light-emitting element is connected with the third node and the second power supply signal terminal respectively;

the second light-emitting element is connected with the third node and the second power supply signal terminal respectively;

the driving control sub-circuit comprises: a second transistor; a third transistor; a fourth transistor; a fifth transistor; and the capacitor;

a first electrode of the second transistor is connected with a fourth node, a control electrode of the second transistor is connected with the first scanning signal terminal, and a second electrode of the second transistor is connected with the first node;

a first electrode of the third transistor is connected with the second power supply signal terminal, a control electrode of the third transistor is connected with the first scanning signal terminal, and a second electrode of the third transistor is connected with the fourth node;

a first electrode of the fourth transistor is connected with a fifth node, a control electrode of the fourth transistor is connected with the second scanning signal terminal, and a second electrode of the fourth transistor is connected with the second node;

a first electrode of the fifth transistor is connected with the fifth node, a control electrode of the fifth transistor is connected with the second scanning signal terminal, and a second electrode of the fifth transistor is connected with the third node;

a first end of the capacitor is connected with the fourth node, and a second end of the capacitor is connected with the fifth node; and the third transistor and the fourth transistor are N-type transistors, and the second transistor and the fifth transistor are P-type transistors.

2. The pixel circuit according to claim 1, wherein:
the first light-emitting element comprises a first organic light-emitting diode; the second light-emitting element comprises a second organic light-emitting diode; an anode of the first organic light-emitting diode is connected with the third node, and a cathode of the first organic light-emitting diode is connected with the second power supply signal terminal; and a cathode of the second organic light-emitting diode is connected with the third node, and an anode of the second organic light-emitting diode is connected with the second power supply signal terminal.

3. The pixel circuit according to claim 2, wherein:
the first power supply signal terminal is configured to provide a signal of a first level in the first light-emitting time period and a signal of a second level in the second light-emitting time period; and the second power supply signal terminal is configured to provide a signal of the second level in the first light-emitting time period and a signal of the first level in the second light-emitting time period.

4. A display panel, comprising: a plurality of sub-pixels arranged in an array, each sub-pixel comprising a pixel circuit, wherein at least one pixel circuit is the pixel circuit according to claim 3.

5. A display panel, comprising: a plurality of sub-pixels arranged in an array, each sub-pixel comprising a pixel circuit, wherein at least one pixel circuit is the pixel circuit according to claim 2.

6. The pixel circuit according to claim 1, wherein
the input sub-circuit comprises: a first transistor; a first electrode of the first transistor is connected with the data signal terminal, a control electrode of the first transistor is connected with the first scanning signal terminal, and a second electrode of the first transistor is connected with the first node, and wherein the first transistor is an N-type transistor.

7. A display panel, comprising: a plurality of sub-pixels arranged in an array, each sub-pixel comprising a pixel circuit, wherein at least one pixel circuit is the pixel circuit according to claim 6.

8. The pixel circuit according to claim 1, wherein
the light-emitting control sub-circuit comprises: a sixth transistor; a first electrode of the sixth transistor is connected with the first power supply signal terminal, a control electrode of the sixth transistor is connected with the light-emitting control signal terminal, and a second electrode of the sixth transistor is connected with the second node, wherein the sixth transistor is an N-type transistor.

9. A display panel, comprising: a plurality of sub-pixels arranged in an array, each sub-pixel comprising a pixel circuit, wherein at least one pixel circuit is the pixel circuit according to claim 8.

10. The pixel circuit according to claim 1, wherein
the driving sub-circuit comprises: a seventh transistor; a first electrode of the seventh transistor is connected with the second node, a control electrode of the seventh transistor is connected with the first node, and a second electrode of the seventh transistor is connected with the third node, wherein the seventh transistor is a P-type transistor.

11. The pixel circuit according to claim 1, wherein:
the input sub-circuit comprises: a first transistor; a first electrode of the first transistor is connected with the data signal terminal, a control electrode of the first transistor is connected with the first scanning signal terminal, and a second electrode of the first transistor is connected with the first node;

the light-emitting control sub-circuit comprises: a sixth transistor; a first electrode of the sixth transistor is connected with the first power supply signal terminal, a control electrode of the sixth transistor is connected with the light-emitting control signal terminal, and a second electrode of the sixth transistor is connected with the second node;

the driving sub-circuit comprises: a seventh transistor; a first electrode of the seventh transistor is connected with the second node, a control electrode of the seventh transistor is connected with the first node, and a second electrode of the seventh transistor is connected with the third node;

the first light-emitting element comprises: a first organic light-emitting diode; the second light-emitting element comprises: a second organic light-emitting diode, wherein an anode of the first organic light-emitting diode is connected with the third node, and a cathode of the first organic light-emitting diode is connected with the second power supply signal terminal; and a cathode of the second organic light-emitting diode is connected with the third node, and an anode of the second organic light-emitting diode is connected with the second power supply signal terminal; and the first transistor and the sixth transistor are N-type transistors, and the seventh transistor is a P-type transistors.

12. A display panel, comprising: a plurality of sub-pixels arranged in an array, each sub-pixel comprising a pixel circuit, wherein at least one pixel circuit is the pixel circuit according to claim 1.

13. The display panel according to claim 12, wherein:
the sub-pixel comprises: a substrate; a circuit structure layer disposed on the substrate; a light-emitting structure layer disposed on the circuit structure layer; and an encapsulation layer disposed on the light-emitting structure layer;
the circuit structure layer comprises: a power supply line and a driving transistor;
the light-emitting structure layer comprises: a first light-emitting unit, an isolation layer disposed on the first light-emitting unit, and a second light-emitting unit disposed on the isolation layer;
the first light-emitting unit comprises: a first electrode layer, a first light-emitting layer disposed on the first electrode layer, and a second electrode layer disposed on the first light-emitting layer; and
the second light-emitting unit comprises: a third electrode layer disposed on the isolation layer, a second light-emitting layer disposed on the third electrode layer, and a fourth electrode layer disposed on the second light-emitting layer.

14. The display panel according to claim 13, wherein:
the first electrode layer comprises a first anode of the first light-emitting unit, the first anode is connected with the power supply line in the circuit structure layer through a via; and
the second electrode layer comprises a first cathode of the first light-emitting unit, the first cathode is connected with a first electrode of the driving transistor in the circuit structure layer through a via.

15. The display panel according to claim 13, wherein:
the third electrode layer comprises a second anode of the second light-emitting unit, the second anode is connected with the first electrode of the driving transistor in the circuit structure layer through a via; and
the fourth electrode layer comprises a second cathode of the second light-emitting unit, the second cathode is connected with the power supply line in the circuit structure layer through a lead structure in a peripheral region.

16. A display apparatus, comprising the display panel according to claim 12.

17. A driving method for the pixel circuit according to claim 1, comprising:
in a reset stage, inputting a first power supply signal to the first power supply signal terminal, inputting a second power supply signal to the second power supply signal terminal, inputting a first scanning signal to the first scanning signal terminal, inputting a second scanning signal to the second scanning signal terminal, inputting a light-emitting control signal to the light-emitting control signal terminal, inputting a data signal to the data signal terminal, writing, by the driving control sub-circuit, a voltage of the first power supply signal to a first end of the capacitor and a voltage of the second power supply signal to a second end of the capacitor, and writing, by the input sub-circuit, a voltage of the data signal to the first node;
in a compensation stage, controlling, by the driving control sub-circuit, a voltage at the first end of the capacitor to be constant and a voltage at the second end of the capacitor to be a voltage difference between the voltage of the data signal and a threshold voltage of a driving transistor; and
in a light-emitting stage, by allowing the first power supply signal at a first level and the second power supply signal at a second level in a first light-emitting stage, writing the voltage at the second end of the capacitor to the second node, and controlling the first light-emitting element to emit light and the second light-emitting element not to emit light; and by allowing the first power supply signal at the second level and the second power supply signal at the first level in a second light-emitting stage, writing the voltage at the second end of the capacitor to the third node, and controlling the second light-emitting element to emit light and the first light-emitting element not to emit light.

18. The driving method for the pixel circuit according to claim 17, wherein
the first light-emitting time period and the second light-emitting time period are each a half of a light-emitting time period of a one-frame image.

* * * * *